United States Patent
West et al.

(10) Patent No.: US 10,886,120 B2
(45) Date of Patent: Jan. 5, 2021

(54) HYDROGEN VENTILATION OF CMOS WAFERS

(71) Applicant: TEXAS INSTRUMENTS INCORPORATED, Dallas, TX (US)

(72) Inventors: Jeffrey Alan West, Dallas, TX (US); Adrian Salinas, Garland, TX (US); Elizabeth C. Stewart, Dallas, TX (US); Dhanoop Varghese, Plano, TX (US); Thomas D. Bonifield, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/542,628

(22) Filed: Aug. 16, 2019

(65) Prior Publication Data
US 2020/0058485 A1    Feb. 20, 2020

Related U.S. Application Data

(60) Provisional application No. 62/719,519, filed on Aug. 17, 2018.

(51) Int. Cl.
  *H01L 21/02*    (2006.01)
  *H01L 49/02*    (2006.01)

(52) U.S. Cl.
  CPC .... *H01L 21/0214* (2013.01); *H01L 21/02164* (2013.01); *H01L 28/60* (2013.01)

(58) Field of Classification Search
None
See application file for complete search history.

(56) References Cited

U.S. PATENT DOCUMENTS

| | | | |
|---|---|---|---|
| 9,299,697 B2 | 3/2016 | West et al. | |
| 9,583,558 B2 | 2/2017 | West et al. | |
| 10,147,784 B2 | 12/2018 | West et al. | |
| 2008/0144421 A1* | 6/2008 | Deng | H01L 27/1104 365/230.05 |
| 2015/0333055 A1* | 11/2015 | West | H01L 29/66477 257/306 |

* cited by examiner

*Primary Examiner* — Reema Patel
*Assistant Examiner* — Steven M Christopher
(74) *Attorney, Agent, or Firm* — Andrew R. Ralston; Charles A. Brill; Frank D. Cimino

(57) ABSTRACT

An integrated circuit a semiconductor substrate includes a device die with includes transistors configured to execute an electrical function. A first interconnect layer of the device die is configured to route electrical signals or power to terminals of the transistors. An interlevel dielectric (ILD) layer is located over the interconnect layer. A metal electrode located over the ILD layer. A dielectric barrier layer is located between the ILD layer and the metal electrode. A scribe seal surrounds the device die. A first opening within the dielectric barrier layer surrounds the metal electrode. Second and third openings within the dielectric barrier layer are located between the first opening and the scribe seal.

24 Claims, 14 Drawing Sheets

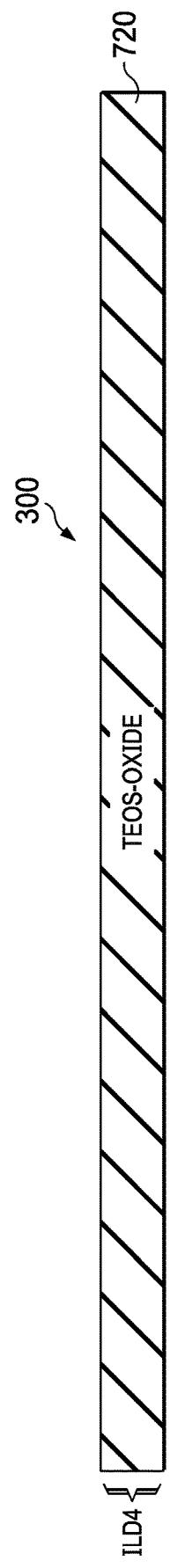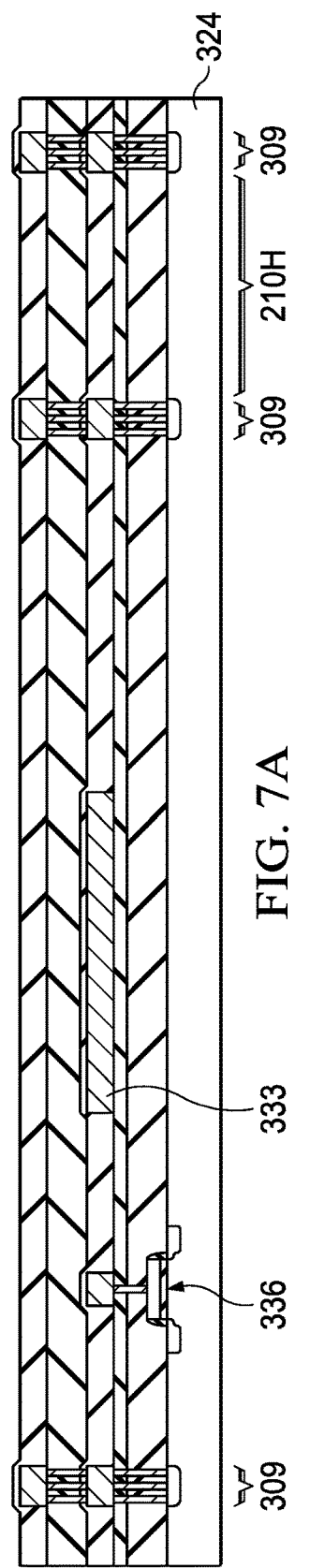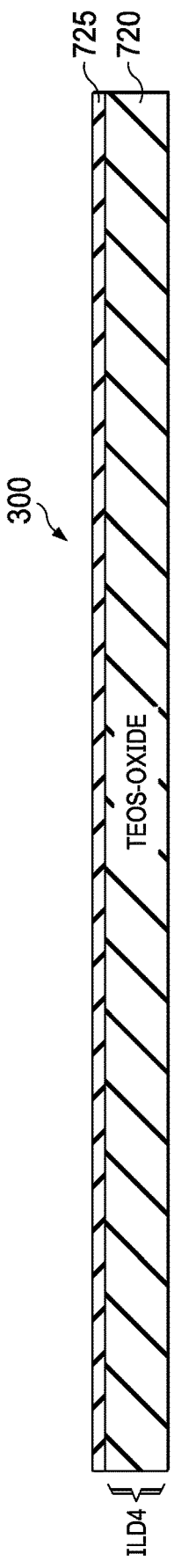
FIG. 7A
FIG. 7B

HYDROGEN VENTILATION OF CMOS WAFERS

CROSS REFERENCE TO RELATED APPLICATIONS

This non-provisional application claims priority based upon U.S. provisional patent applications No. 62/719,519, filed Aug. 17, 2018, which is hereby incorporated by reference in its entirety.

FIELD

This disclosure relates to the field of semiconductor devices, and more particularly, but not exclusively, to reduction of bias temperature instability in MOS devices.

BACKGROUND

Bias-temperature instability (BTI) in a MOS transistor may be categorized as negative bias temperature instability (NBTI) or positive bias temperature instability (PBTI). This effect may manifest for NBTI as a decrease of the transistor threshold voltage in NMOS transistors and consequent decrease in drain current and transconductance of the transistor over the lifetime of the transistor. For PMOS transistors PBTI results in an increase of the threshold voltage, with analogous effects on operation.

SUMMARY

The inventors disclose various methods and devices that may be beneficially applied to manufacturing integrated circuits (ICs), e.g. to reduce the effects of positive bias temperature instability (PBTI) in transistors. While such embodiments may be expected to provide a reduction of PBTI-related device instability, no particular result is a requirement of the described invention(s) unless explicitly recited in a particular claim.

The disclosure presents an electronic device, e.g. an integrated circuit (IC) die, formed over a semiconductor substrate. The IC die includes transistors configured to execute an electrical function and a scribe seal running along a perimeter of the device. A first interconnect layer of the device die is configured to route electrical signals or power to terminals of the transistors. An interlevel dielectric (ILD) layer is located over the interconnect layer, and a metal electrode is located over the ILD layer. A dielectric barrier layer is located between the ILD layer and the metal electrode. A first opening within the dielectric barrier layer surrounds the metal electrode. Second and third openings within the dielectric barrier layer are located between the first opening and the scribe seal. The disclosure further presents methods of forming an IC die as described above.

BRIEF DESCRIPTION OF THE VIEWS OF THE DRAWINGS

FIGS. 7A-7J illustrate stages of formation of an electronic device including peripheral openings and scribe line openings consistent with the disclosed principles.

DETAILED DESCRIPTION

The present disclosure is described with reference to the attached figures. The figures may not be drawn to scale and they are provided merely to illustrate the disclosure. Several aspects of the disclosure are described below with reference to example applications for illustration, in which like features correspond to like reference numbers. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events may be required to implement a methodology in accordance with the present disclosure.

While various examples of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

Figure 1:
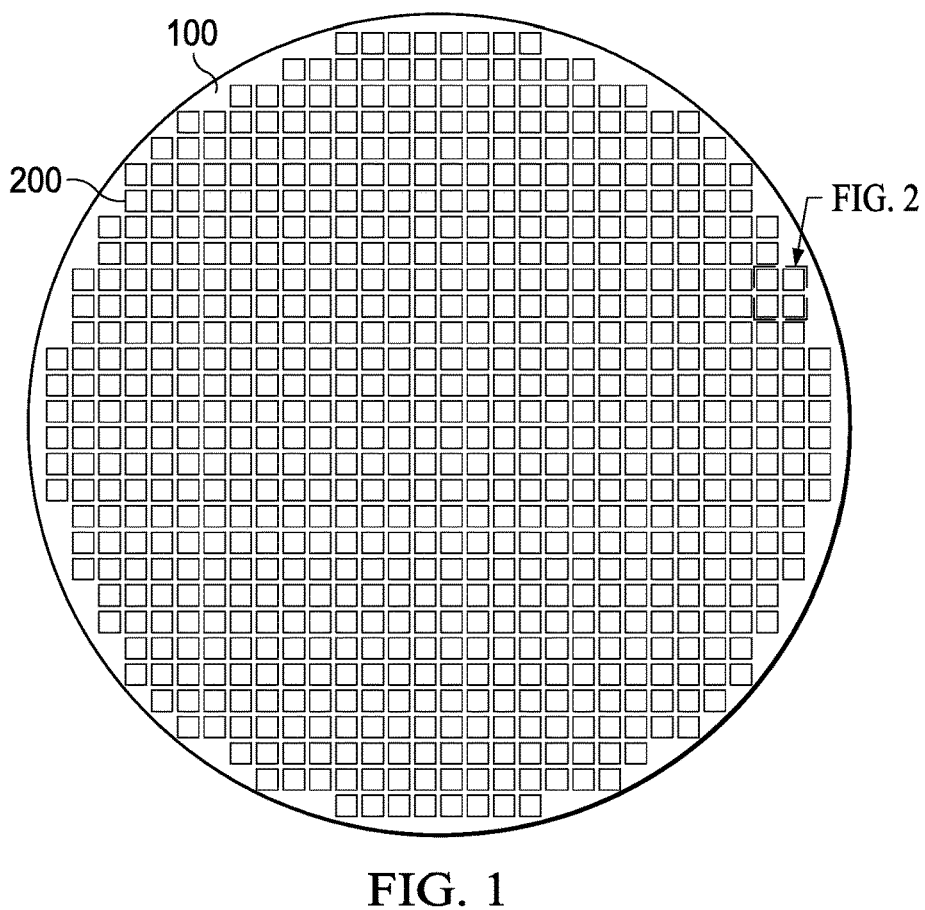
FIG. 1 illustrates a semiconductor wafer having an array of device die formed thereon, with scribe lanes between the die.

FIG. 1 illustrates a representative semiconductor wafer 100, e.g. a silicon wafer, at a late stage of manufacturing an array of integrated circuit (IC) die 200. The die 200 are typically nominally identical, and are spaced apart from each other by horizontal and vertical scribe lanes 210H, 210V (see FIG. 2). The scribe lanes 210H, 210V provide a path with which to separate, or singulate, the die 200 from each other prior to packaging. A singulation process may use mechanical separation (e.g. saw) or focused energy separation (e.g. laser). Generally various metrology and/or test structures may be placed in the scribe lanes to aid the manufacturing process, e.g. by measuring critical dimensions or layer thicknesses, or providing inline electrical test structures. These structures are typically destroyed by the singulation process.

Figure 2:
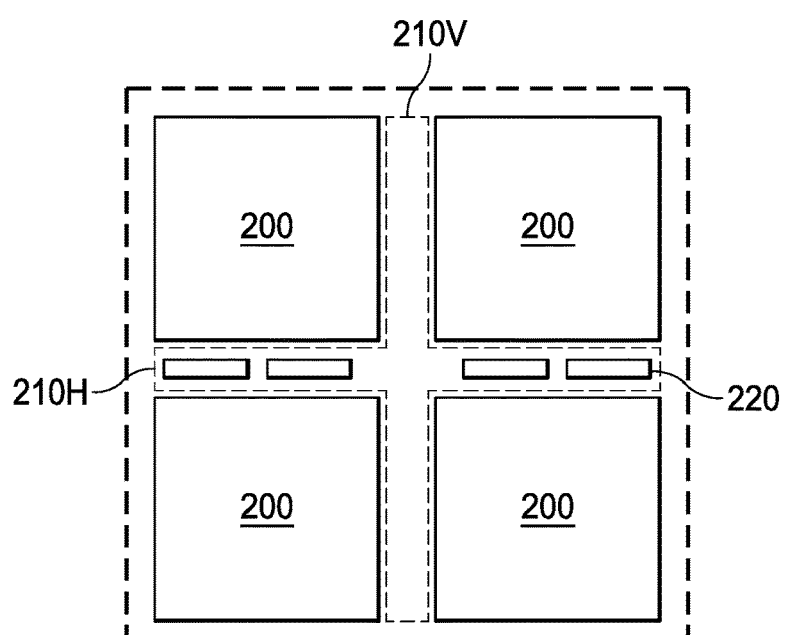
FIG. 2 provides a detail view of a portion of the wafer of FIG. 1.

FIG. 2 illustrates a detail view of a portion of the wafer 100. Four instances of the device die 200 are included, and are spaced apart by a scribe lane 210, differentiated as the horizontal scribe lane 210H and the vertical scribe lane 210V. Several scribe lane modules 220 are shown in the scribe lane 210H. The scribe lane modules 220 may provide various structures that may be useful in manufacturing the device die 200. For example, the scribe lane modules 220 may include parametric test structures and/or devices or metrology structures used to determine thicknesses of various layers during the manufacturing process. As described further below, the scribe lane 210H may include multiple placements of a scribe lane module that includes an opening in a dielectric barrier layer that overlies the die 200.

Figure 3A:
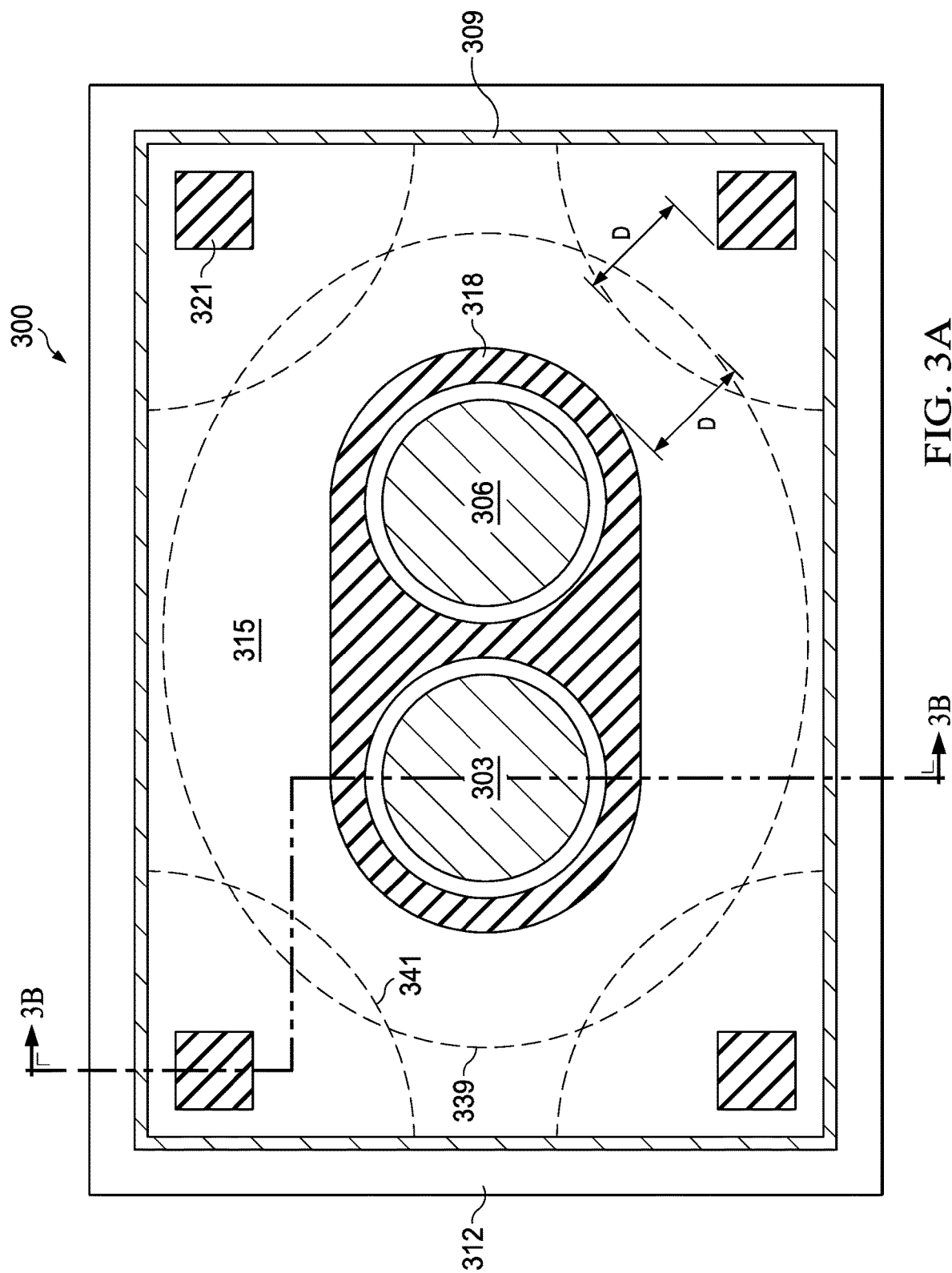
FIGS. 3A and 3B illustrates various aspects of a semiconductor device that may be formed on the wafer of FIG. 1, including peripheral openings that may vent hydrogen from silicon oxide or other layers of the device.

FIG. 3A illustrates an example of an electronic device 300, e.g. an integrated circuit, which may be a particular design of the die 200. Without implied limitation the device 300 in the illustrated example provides an isolation circuit between a high-voltage signal path and a low-voltage signal path. A first top-level metal plate 303 and a second top-level metal plate 306 may be high-voltage nodes or electrodes of the isolation circuit. A scribe seal 309 surrounds the metal plates 303, 306, and generally runs close to and parallel to a die edge 312. In the illustrated view a dielectric barrier layer 315 overlies the device 300. An annular trench opening 318 in the dielectric barrier layer 315 surrounds the plates 303, 306. Peripheral openings 321 are spaced apart from the annular opening 318, for example near corners of the device 300. While the top-level metal plates 303 and 306 are shown as about centered within the scribe seal 309, in other examples they may be located closer to one die edge than an opposite die edge. In such examples, it may be preferred to locate the peripheral openings 321 in a wider portion of the dielectric barrier layer 315 between annular trench opening 318 and the scribe seal.

Figure 3B:
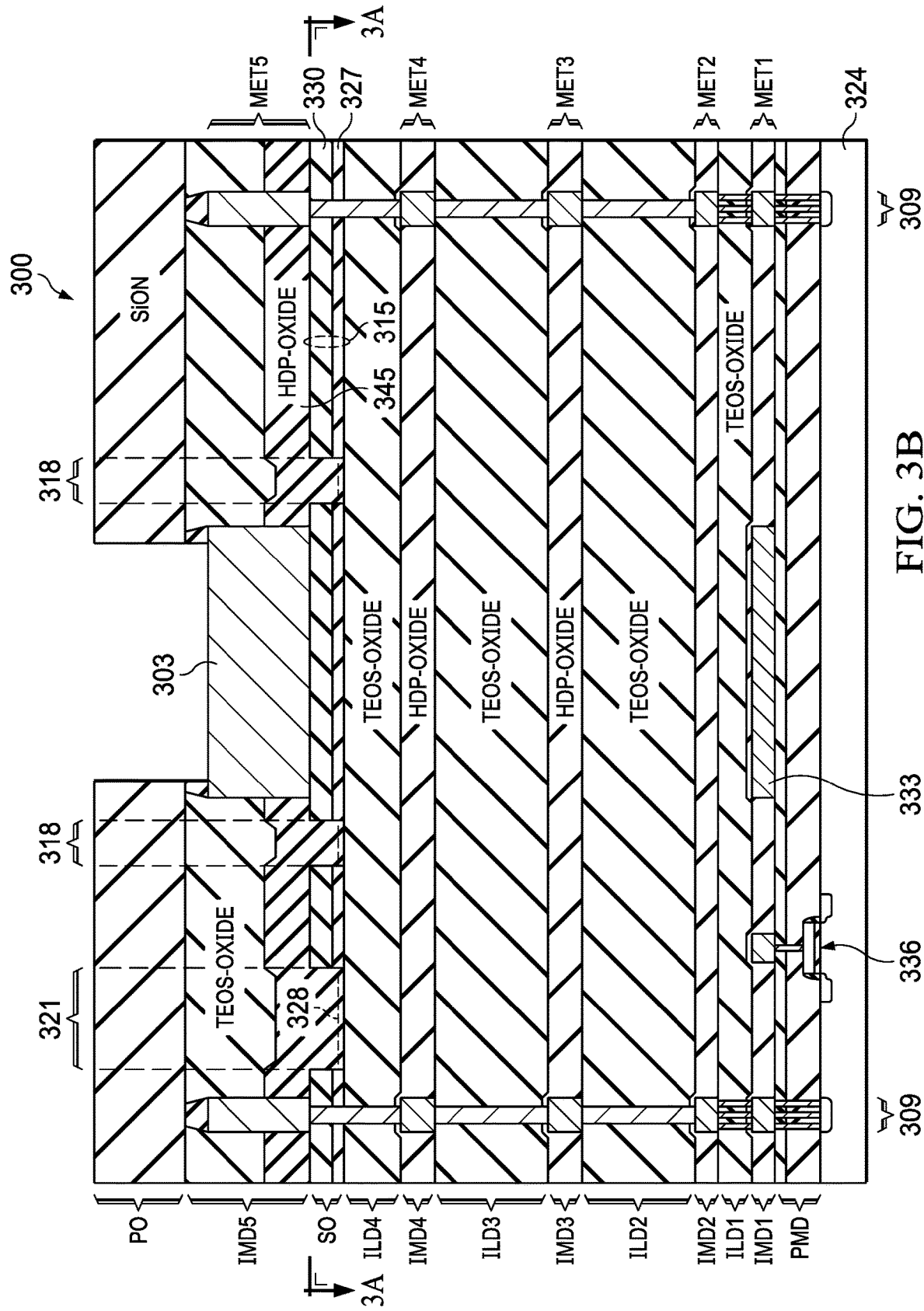

FIG. 3B illustrates an offset sectional view of the device 300, as shown by the path marked in FIG. 3A. The device 300 is shown without implied limitation as having five metal levels MET1 through MET5 over a semiconductor substrate 324. A PMD layer covers the substrate 324, followed by intrametal dielectric (IMD) levels IMD1 through IMD5, and interlevel dielectric (ILD) levels ILD1 through ILD4. The dielectric barrier layer 315 is located between ILD4 and IMD5, and is implemented as an SO (Silicon nitride/silicon Oxynitride) bilayer that includes a first sublayer 327 of silicon oxynitride (SiON) and a second sublayer 330 of silicon nitride (SiN). Those skilled in the pertinent art will appreciate that the empirical formulas SiN and SiON are merely representative of the respective materials silicon nitride and silicon oxynitride, which may have a non-stoichiometric composition, e.g. non-integer values of the component elements. The SO bilayer may enhance electrical isolation between the metal plates 303 and 306, which may be at a high voltage, and the scribe seal 309, which may be at a low voltage, e.g. ground. For additional details of the SO bilayer see U.S. Pat. No. 10,147,784, incorporated herein by reference in its entirety. In one example, the first sublayer 327 may have a thickness of about 300 nm, and the second sublayer 330 may have a thickness of about 600 nm under the metal plate 303 and about 500 nm lateral to the metal plate 303 due to overetch of the metal plate. In another example the second sublayer 330 may have an as-deposited thickness about twice that of the as-deposited thickness of the first sublayer 327.

In some examples, the annular trench opening 318 and peripheral openings 321 extend through the SO bilayer, exposing the ILD4 level below. In some other examples a portion of the first sublayer 327 remains at the bottom of the openings 318 and 321, and the ILD4 level is not exposed in such examples. This remaining portion may be referred to as a Land-in SiON, or "LiSiON" layer 328. For the purposes of this discussion and the claims, the openings 318 and 321 are defined as "openings" in the dielectric barrier layer 315, and the annular trench opening 318 and the peripheral opening 321 are defined as "open area", whether the LiSiON layer is present or not. A PO layer overlies the IMD5 level and may also comprise SiON. An unreferenced pad opening provides access to the metal plate 303 for electrical contact, e.g. by wirebonding.

The bottom metal plate 333 and a corresponding bottom metal plate under the top metal plate 306 may be low-voltage nodes or electrodes of the isolation circuit. The metal plates 303 and 333 may operate as a capacitor, and an information-modulated signal coupled between the plates 303 and 333 may be directed to or from a transistor 336 by an interconnection not seen in the plane of the figure. The transistor 336 is representative of functional circuitry in or over the substrate 324 that may provide amplification, buffering or domain conversion for the information-modulated signal.

In various examples, the IMD1 . . . IMD4 levels are implemented at least partially with HDP oxide, and the ILD1 . . . ILD4 layers are implemented at least partially with TEOS-oxide. The IMD5 layer is implemented with a lower HDP-oxide sublayer and an upper TEOS-oxide sublayer. TEOS-oxide may be produced by a plasma-enhanced chemical vapor deposition (PECVD) process in a capacitively-coupled plasma reactor using tetraethoxysilane (TEOS) feedstock. HDP-oxide may be produced by using a high-density plasma (HDP) in an inductively-coupled reactor using silane ($SiH_4$) feedstock.

In the high-density plasma, atomic hydrogen may be produced that is incorporated into the device 300. Some of this hydrogen may migrate into transistors, e.g. the transistor 336. At the transistors, the mobile hydrogen may concentrate at surfaces and/or grain boundaries of the polysilicon transistor gate, and under the stress of operational electric fields, eventually diffuse into the underlying gate oxide, thereby shifting the threshold voltage ($V_T$) of the transistor.

One manifestation of this $V_T$ shift is positive bias temperature instability (PBTI). Analogous to negative temperature bias instability (NBTI), PBTI typically only affects PMOS transistors, and is generally more pronounced at higher temperatures. The $V_T$ shift is typically positive, which may cause the drive current of the transistor to decrease over time. This decrease may lead to mismatch between nominally identical transistors, and/or weakened devices, possibly leading to device failure.

For semiconductor devices lacking the SO bilayer, PBTI may not be operationally significant. The mobile hydrogen in the polysilicon transistor gates may be purposely or incidentally driven out of the polysilicon or out of the semiconductor device by a thermal process, e.g. an $N_2$ sinter, after the device 300 is formed. However, with an SO bilayer in place, the hydrogen may not be effectively removed by the sinter, as a diffusion coefficient $D_{H,SiN}$ of hydrogen in SiN may be significantly lower than a diffusion coefficient $D_{H,SiO}$ of hydrogen in silicon oxide. Thus the SO bilayer, and in particular the SiN sublayer, may be an effective dielectric barrier layer to hydrogen out-diffusion from the dielectric stack. As used herein, a dielectric barrier layer includes one dielectric material layer or multiple dielectric material sublayers, wherein the one dielectric material layer or at least one of the multiple dielectric material sublayers has a hydrogen diffusion coefficient that is lower than a hydrogen diffusion coefficient in silicon oxide.

It is believed that the trench opening 318 provides sufficient exposed area of the ILD4 layer (TEOS-oxide), or of the LiSiON layer if present, that sufficient hydrogen is removed from the device 300 during subsequent high temperature processes used to complete the manufacturing of device 300 that PBTI is not a significant operational issue when the lateral extent of the device 300 die is small enough that the diffusion path length from any location on the die to the annular trench opening 318 is small enough to ensure sufficient outgassing of the hydrogen. However, it has been discovered by the inventors that when the lateral extent of the die exceeds a threshold value, the hydrogen may no longer be sufficiently removed by the subsequent processing, and deleterious PBTI effects may result in the finished device 300. Such a die may be referred to for convenience, without implied limitation, as a "large die". While the critical size of the die may vary depending on factors such as aspect ratio (die length divided by die width) and metallization density, it is believed that PBTI may result in some devices when one or more of the die edges are more than about 250 μm from the annular trench opening 318.

Referring again to FIG. 3A, a diffusion perimeter 339 visualizes a lateral extent of the device 300 die that may adequately vent hydrogen through the annular trench opening 318. The lateral extent may have a minimum value D in a direction determined in part by the geometry of the annular trench opening 318. Portions of the die outside the diffusion perimeter 339 on a large die may not be sufficiently vented without the peripheral openings 321 to adequately reduce PBTI effects. A diffusion perimeter 341 associated with each peripheral opening 321 visualizes a lateral extent of the device 300 die that may be vented by each associated peripheral opening 321. It may be preferred that the diffusion perimeters 339 and 341 touch or overlap as shown. While the illustrated arrangement of the peripheral openings 321 may not ensure that every location on the die has a short diffusion path to an SO opening, depending on the location of sensitive transistors such a layout may be sufficient to adequately reduce PBTI effects in the completed device.

While the peripheral openings 321 are shown located in corners of the device 300, devices within the scope of this disclosure are not limited to such an arrangement. For example, one or more of the peripheral openings 321 may be located along a side of the die between corners. In another example, the peripheral openings 321 may be spaced further from the die sides to provide larger overlap of the perimeters 339 and 341 or to vent a larger area of the die, for example when the scribe seal 309 is more than 250 μm from the annular trench opening 318. In general it may be preferred to place the peripheral openings 321 such that the side of the opening closest to the scribe seal 309 is no further than about 250 μm from the scribe seal 309. Furthermore, while four peripheral openings 321 are shown, any number two or greater of the peripheral openings 321 may be used. In some examples, sensitive transistors may be located, or concentrated, on one side of the die. In such examples, it may be sufficient to locate only two peripheral openings 321 on that side of the die.

The peripheral openings 321 may be implemented in any geometric shape, and have any associated open area. In one nonlimiting example, the peripheral openings 321 may be square with 10 μm sides, thus having an open area of 100 μm². Depending on, e.g. physical design constraints and desired total open area, more peripheral openings 321 having a smaller open area or fewer peripheral openings 321 having a larger open area may be placed in a particular IC design.

Some previous devices included an opening in the SO bilayer to provide a single optical window for one-time programming (OTP) of a memory circuit. Even if such an optical window were present on the device 300, it would not be sufficient to adequately reduce the PBTI effect for at least two reasons. First, wherever the optical window is placed, it would not provide venting over a sufficient portion of the device 300 die. For example, if the optical window were placed on the left side of the die, the right side of the die would remain insufficiently vented. Second, the relevant memory circuit, if present, is within the portion of the die that is already sufficiently vented by the annular trench opening 318. Thus, the additional SO bilayer open area provided by the optical window would not significantly add to the hydrogen venting already provided by the annular trench opening 318.

Figure 4A:
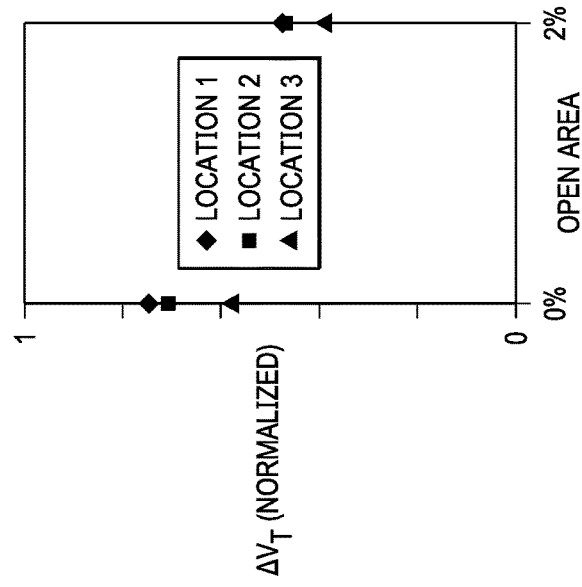
FIGS. 4A and 4B illustrate reduction of $\Delta V_T$ as a function of open area of a silicon nitride/silicon oxynitride barrier layer in a test device.
Figure 4B:
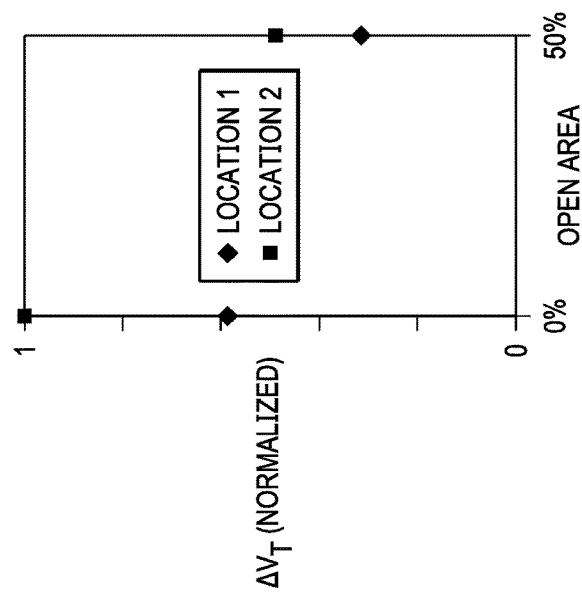

FIG. 4A graphically illustrates a reduction of PBTI in normalized $\Delta V_T$ versus percent open area of the SO bilayer for 0% and 50%. FIG. 4B similarly illustrates a reduction of $\Delta V_T$ versus percent open area for 0% and 2%. FIG. 4A was determined from two locations on a test wafer for each open area condition, and FIG. 4B was determined from three locations on a different test wafer for each open area condition. The apparent wafer-to-wafer scatter at 0%, and the within-wafer scatter, is typical of such measurements. In spite of such scatter, these data, along with additional data not shown here, show a clear reduction of $\Delta V_T$ for both 2% open (vented) area and 50% open area. Moreover, at least for these data there is little if any improvement of $\Delta V_T$ from 2% open area to 50% open area. Additional data not shown in these plots indicates little if any reduction of $\Delta V_T$ at 0.5% SO bilayer open area. It is expected that the reduction of $\Delta V_T$ will asymptotically approach a final value with increasing open area. Thus it is further expected that a useful reduction of $\Delta V_T$ occurs at a cumulative open area greater than 0.5% and less than 2%. While the reduction $\Delta V_T$ at 50% SO bilayer open area is clear, such a large SO bilayer open area may place a burden on the placement of features such as metal interconnects within the device 300 due to design rule constraints. Thus it may be beneficial to limit the open are to no more than needed to obtain a sufficient benefit of reduced $\Delta V_T$. In view of these data and additional considerations, in general it is preferred that the total open area of the annular trench opening 318 and the two or more peripheral openings 321 equal more than 0.5% of the total die area inside the scribe seal 309. In some cases it may be further preferred that the cumulative open area be at least 2% of the total die area inside the scribe seal 309. In still some other cases it may be further preferred that the cumulative open area be no greater than 2% of the total die area inside the scribe seal 309. On the other hand, in some cases it may be prudent to provide a margin for wafer-to-wafer or process-to-process variation, such that it may be preferred that the total open area be about 5% of the total die area inside the scribe seal 309. In some cases the open area may be limited to no more than about 8% of the total die area to avoid violating design rule constraints. A predetermined value of the open area may be enforced by design layout rules and implemented by a pattern generation (PG) tool used to provide optical masks used to pattern various levels of the device 300.

Figure 5:
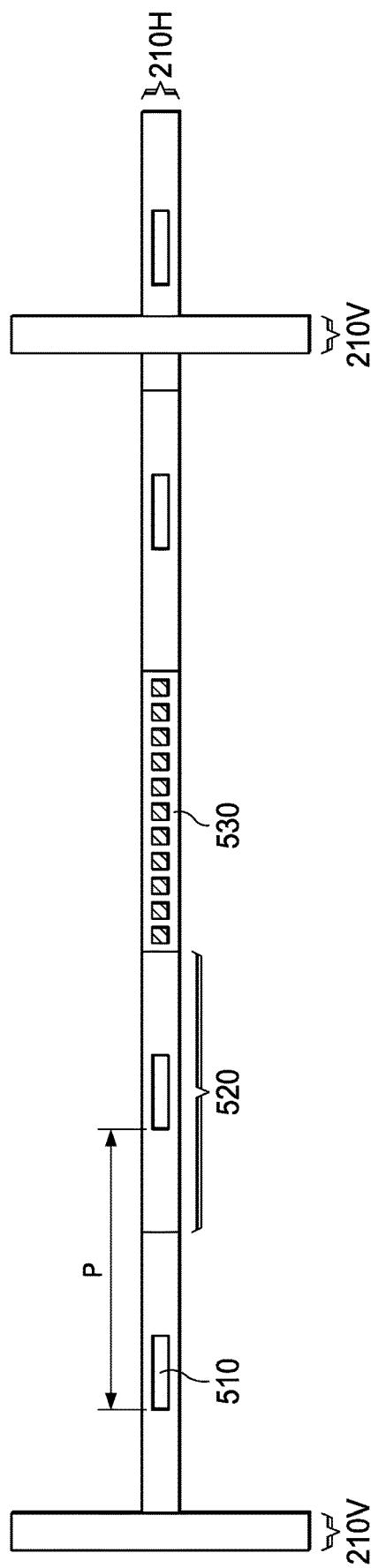
FIG. 5 illustrates a scribe lane that includes a module having a vent opening that may vent hydrogen from silicon oxide or other layers within the scribe lane.

Turning to FIG. 5, an expanded view is shown of the scribe lanes 210V and 210H previously shown in FIG. 2. In addition to the inventive aspects described above, the inventors have further recognized that PBTI effects are manifested in the scribe lanes and may be beneficially mitigated based on principles similar to those described above. It is sometimes the case that the parametric test module 200 includes one or more PMOS transistors for the purpose of determining operating parameters of PMOS transistors located in the area circumscribed by the scribe seal 309. Because the scribe seal 309 may act as an effective barrier to mobile hydrogen within the dielectric stack of the device 300, the peripheral openings 321 are not expected to vent hydrogen from the scribe lanes 210. Thus the PMOS parametric test modules may be affected by PBTI without mitigation.

Therefore the disclosure provides optional scribe lane hydrogen vents 510 that provide open area within the scribe lane 210H. In the current example, no parametric test module need be placed in the scribe lane 210V, so no scribe lane hydrogen vents are placed in the scribe lane 210V. In other examples that include parametric test modules in a vertical scribe lane, scribe lane hydrogen vents may also be placed there. Each of the scribe lane hydrogen vents 510 is formed using the principles described above, e.g. a trench opening formed partially or completely through the SO bilayer. Advantageously, the scribe lane hydrogen vents 510 may be implemented by defining a scribe lane module 520 having same dimensions as parametric test modules placed in the scribe lane 210H, e.g. such as a parametric test module 530. When multiple instances of the scribe lane module 520 are placed in the scribe lane the associated multiple hydrogen vents 510 may be spaced from each other by an integer multiple of a pitch P.

Figure 6A:
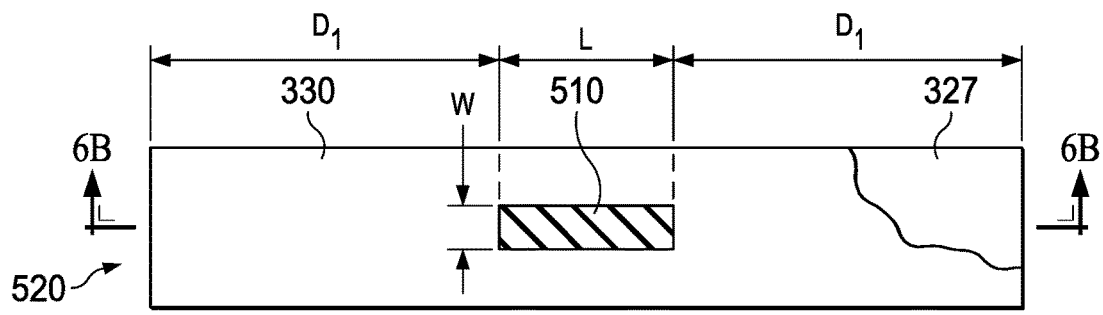
FIGS. 6A and 6B illustrate features of the scribe lane module of FIG. 5.
Figure 6B:
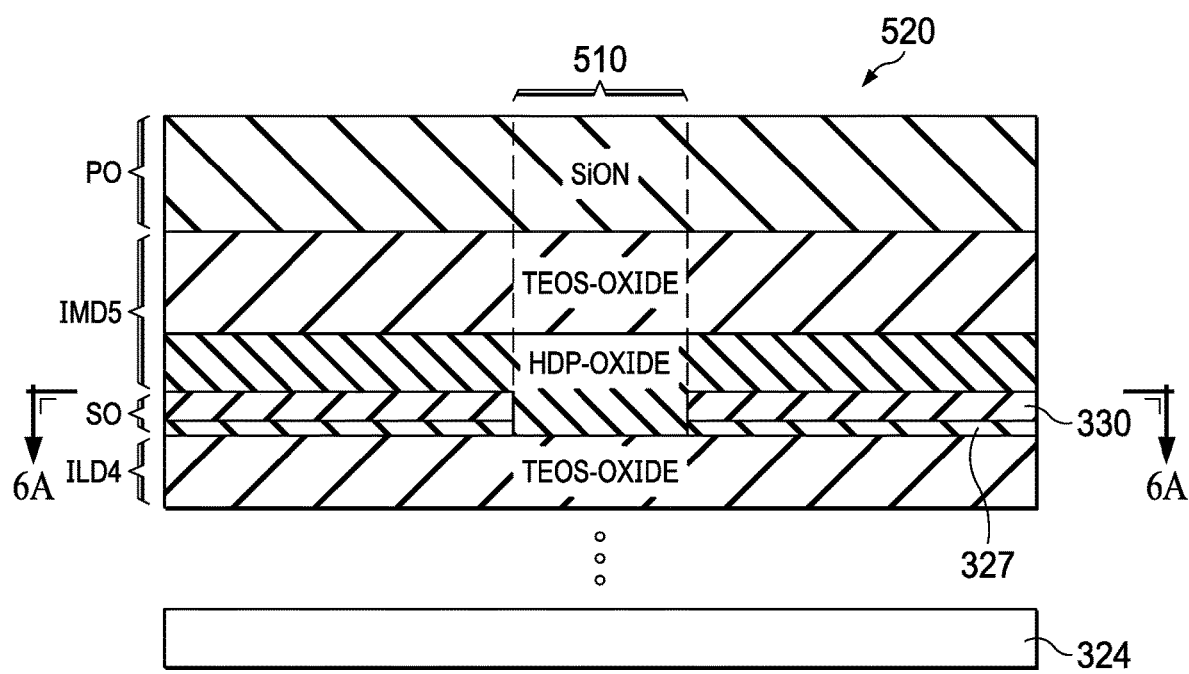

FIGS. 6A and 6B illustrate an example scribe lane module 520 in plan view (FIG. 6A) and section view (FIG. 6B). In FIG. 6A, an instance of the scribe lane opening 510 is shown having a length L and width W about centered within the scribe lane module 520, reflected by a distance $D_1$ from a leftmost extent of the scribe lane module 520 to a leftmost extent of the scribe lane opening 510, and the distance $D_1$ from a rightmost extent of the scribe lane module 520 to a rightmost extent of the scribe lane opening 510. In other examples the scribe lane opening 510 may not be centered within the scribe lane module 520. In one example, the scribe lane module 520 has a total length $2 \cdot D_1 + L$ of about 500 µm, which is also the value of the pitch P in this example. Thus no part of the parametric test module 530 is further than about 250 µm from a nearest instance of a neighboring scribe lane opening 510. The length L may be about 100 µm in some examples, and the width W may be about 20 µm. Of course other values of length and width are contemplated in view of particular design constraints of the device 300 and scribe lanes 210. The scribe lane module 520 module may be defined as a PG module and placed as many times as needed to meet the predetermined global design rule for SO open area in the scribe lane 210H, e.g. about 2%, or in some cases between 2% and 5%. Parametric test modules may be placed in the scribe lane 210H as desired to provide relevant inline parametric test data.

Figure 7C:
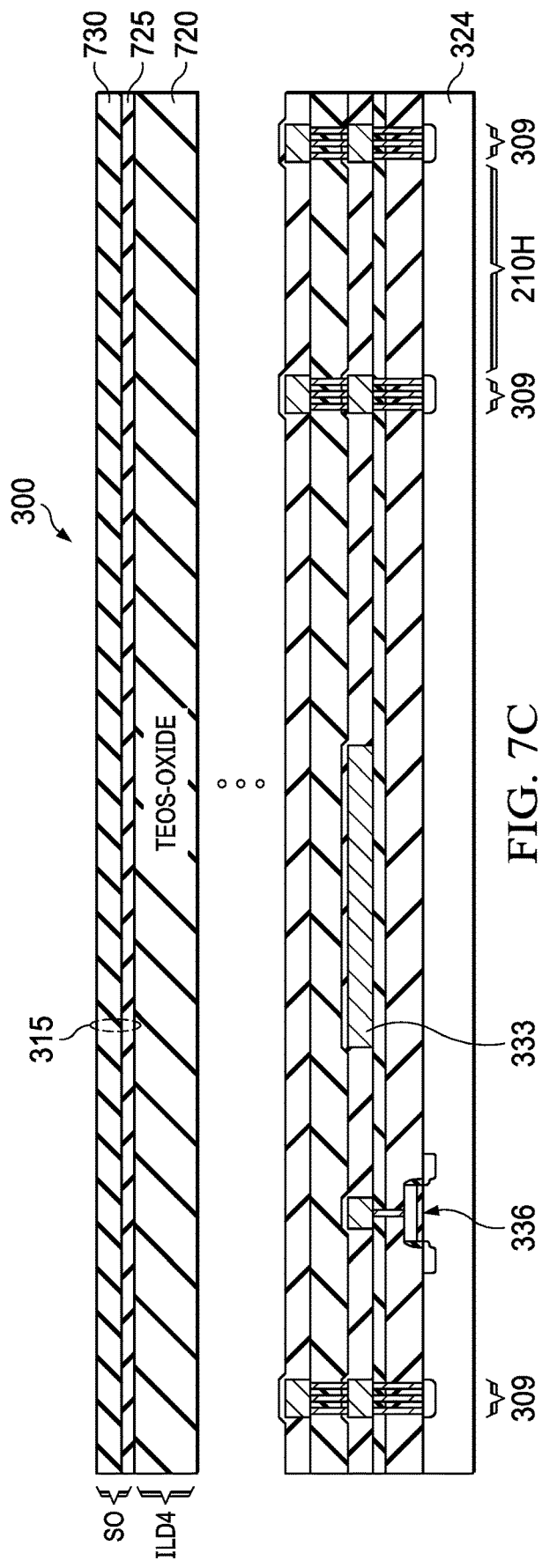

FIGS. 7A-7J illustrate a method 700 of forming an electronic device, e.g. an IC such as the device 300. Features of the method are presented with reference to the device 300 without implied limitation. The method 700 shows the device in a section taken as the section 3B, with addition of the scribe lane 210H adjacent the device. Some features common with FIGS. 3A and 3B retain their reference numbers. Initially, FIG. 7A presents the device 300 at an intermediate stage of manufacturing, in which the bottom metal plate 333 and the transistor 336 have been formed. A TEOS-oxide layer 720 corresponding to the ILD4 level has been formed.

Figure 7D:
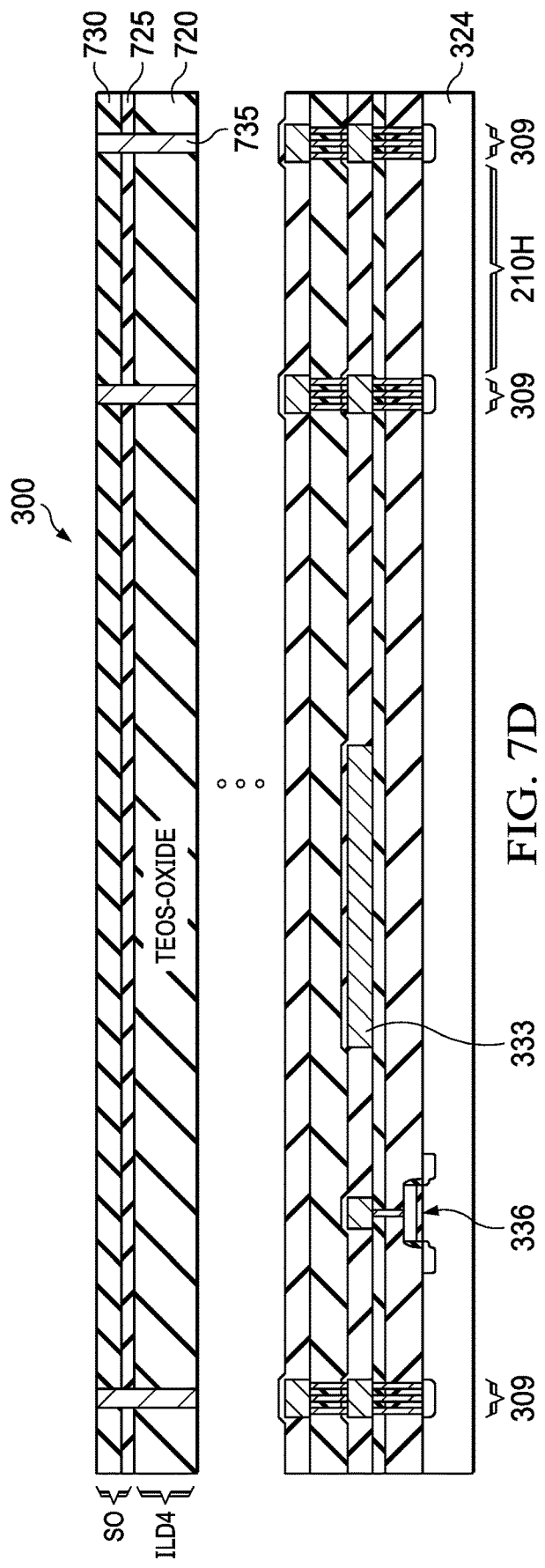
Figure 7E:
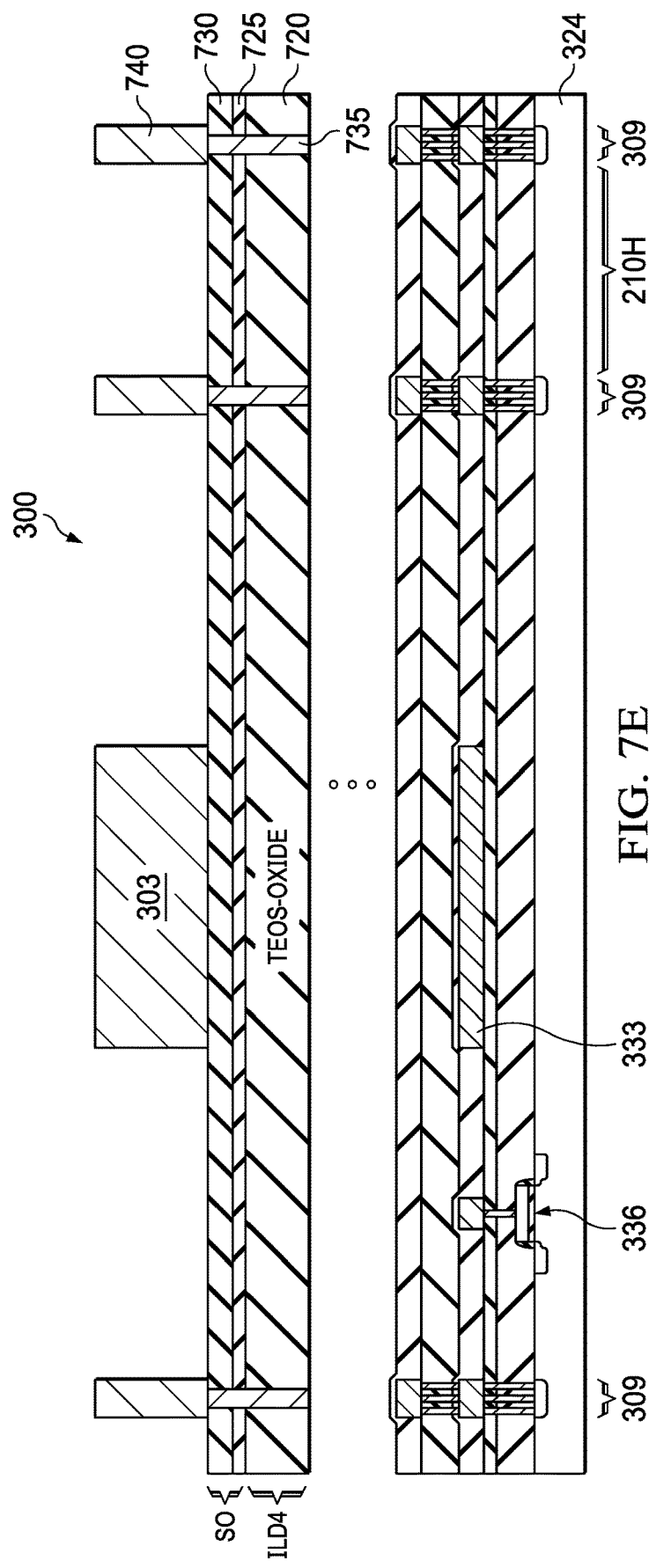

In FIG. 7B a silicon oxynitride layer 725 is formed on the TEOS-oxide layer 720 by a process that may be conventional. In FIG. 7C a silicon nitride layer 730 is formed on the silicon oxynitride layer 725, by a process that may again be conventional. The layers 725 and 730 constitute the SO bilayer of FIG. 3, e.g. a dielectric barrier layer. In FIG. 7D vias 730 are formed, e.g. by dielectric pattern and etch followed by a tungsten-fill process. In FIG. 7E MET5 features 740, including the top metal plate 303, have been formed, e.g. by aluminum deposition, pattern and subtractive etch.

Figure 7F:
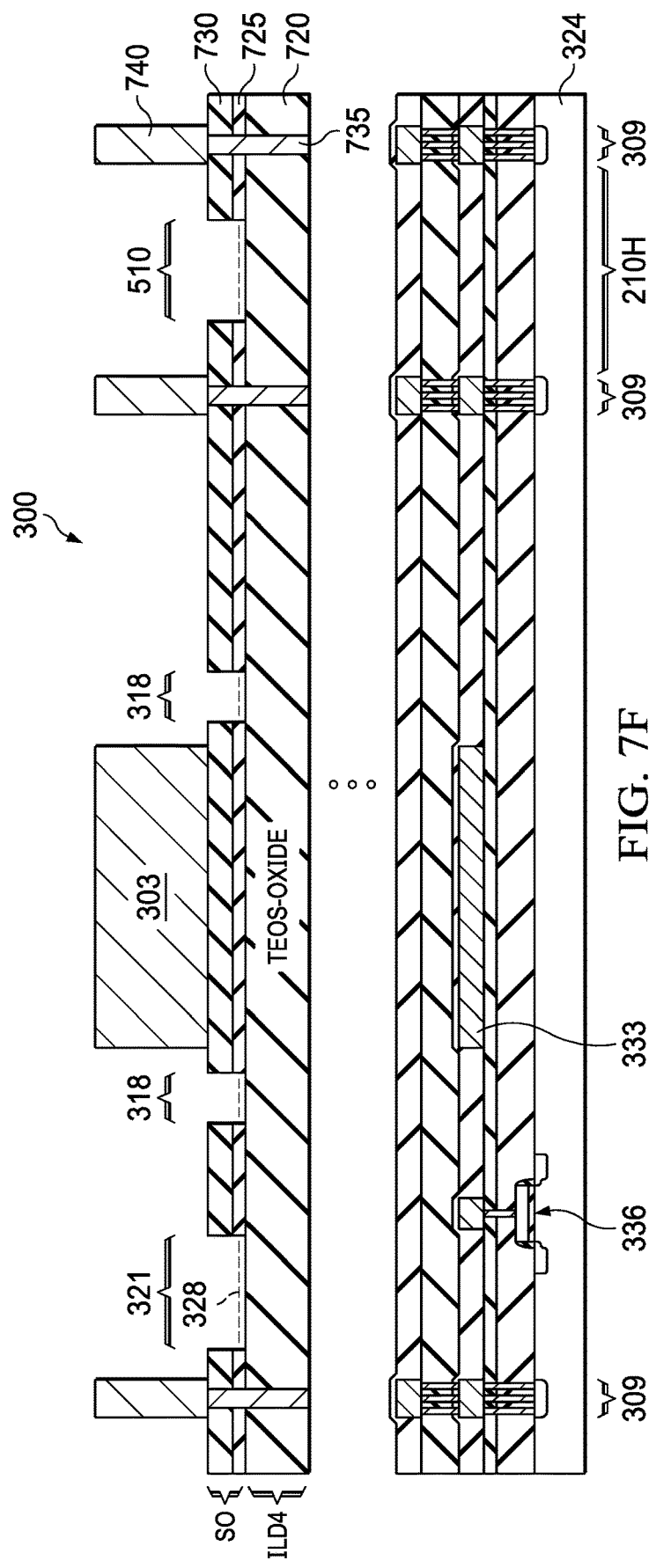

In FIG. 7F portions of the SO bilayer have been removed by pattern and etch to form the annular trench opening 318, the peripheral opening 321 and the scribe lane opening 510. The etch process may include a first etch chemistry that etches silicon nitride preferentially to silicon oxynitride, stopping after exposing the silicon oxynitride layer 725. In some examples the SO bilayer patterning ends after the silicon nitride etch, leaving the LiSiON layer 328 within the openings. In other examples the silicon nitride etch is followed by a second etch chemistry that etches silicon oxynitride preferentially to silicon oxide, stopping after exposing the TEOS-oxide layer 720. Optionally an overetch may form a shallow trench (not shown) within the TEOS-oxide layer 720.

Figure 7G:
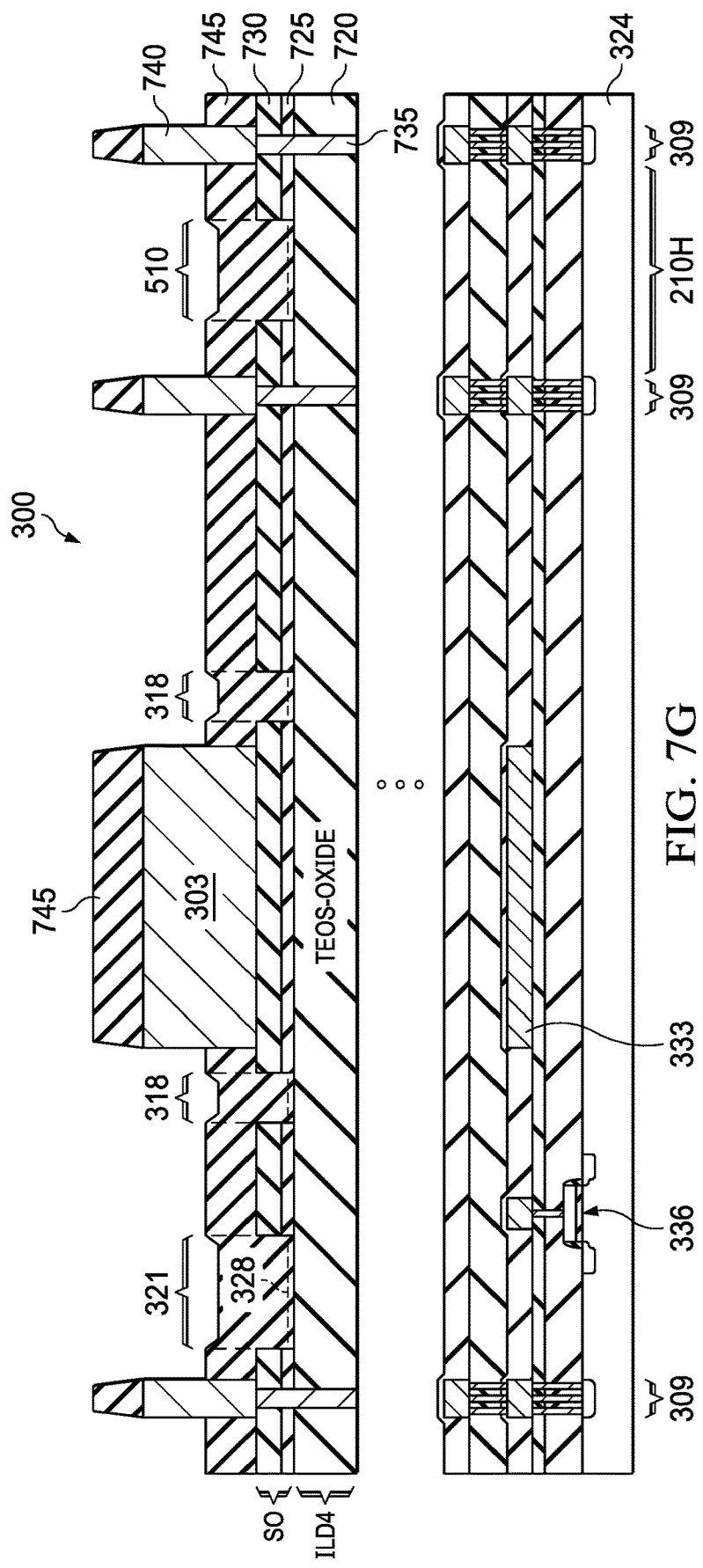

In FIG. 7G an HDP-oxide layer 745 is formed on the MET5 features 740, top metal plate 303 and silicon nitride layer 730. The HDP-oxide layer 745 substantially fills the annular trench opening 318, the peripheral opening 321 and the scribe lane opening 510, and touches the TEOS-oxide layer 720, or the LiSiON layer 328. Portions of the HDP-oxide layer 745, e.g. oxide peaks, are formed on top surfaces of the MET5 features 740. As shown, the surface of the HDP-oxide layer 745 may be recessed over one or more of the openings 318, 321, 510.

Figure 7H:
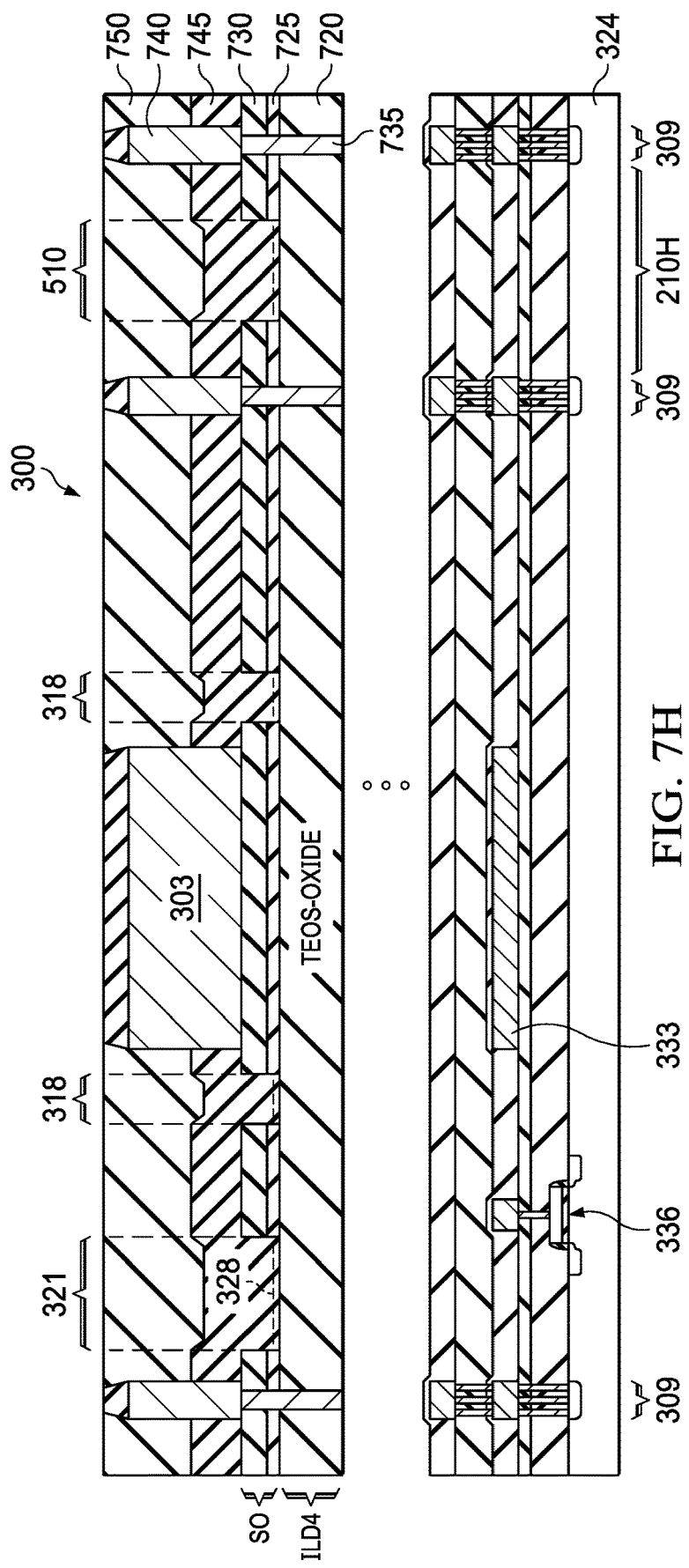
Figure 7I:
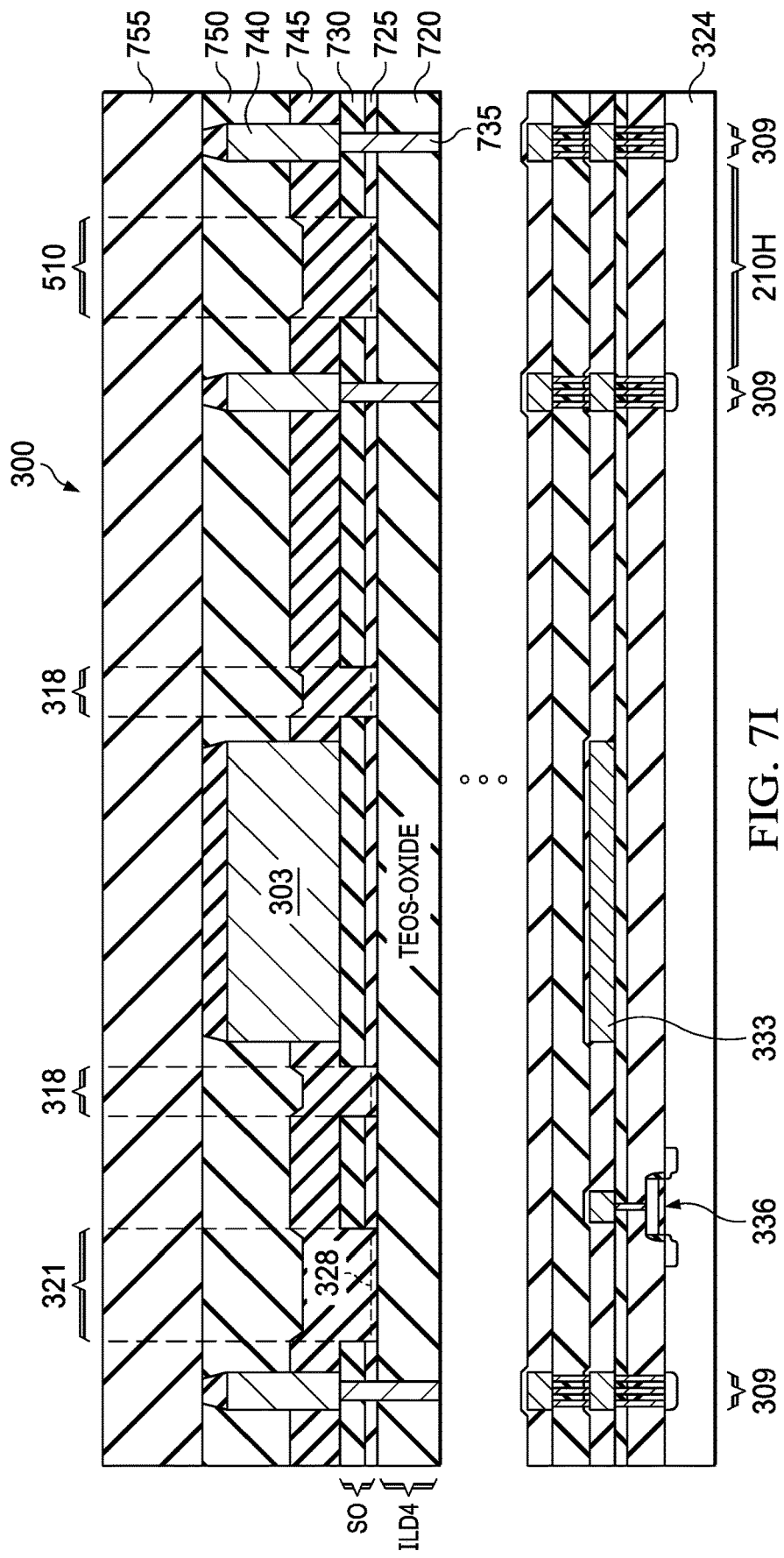
Figure 7J:
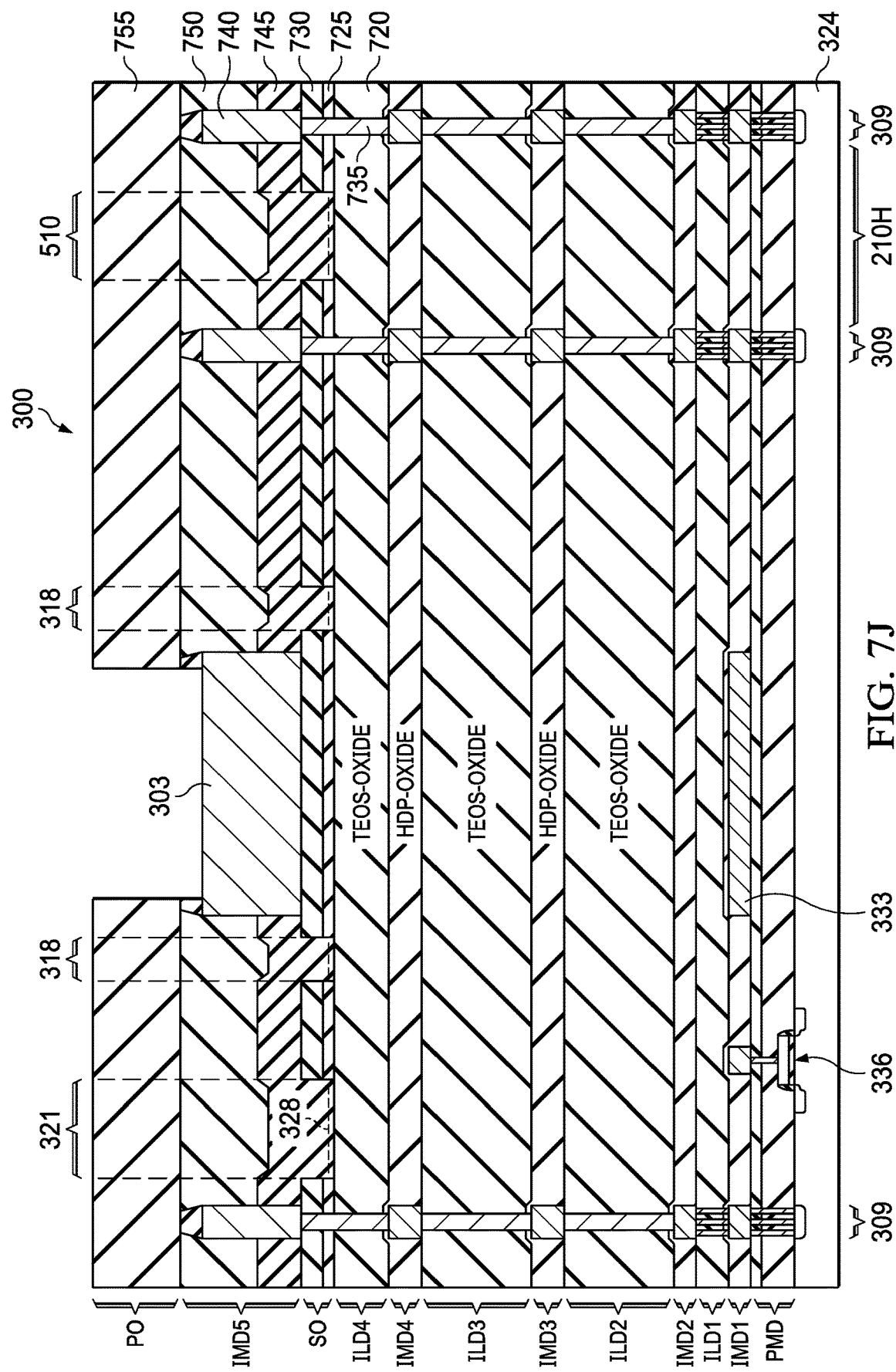

In FIG. 7H a TEOS-oxide layer 750 has been formed over the HDP-oxide layer 745. Initially the TEOS-oxide layer 750 has a nonplanar surface topography reflective of the underlying metal features and oxide peaks. The TEOS-oxide layer 750 has been planarized by a chemical-mechanical polishing (CMP) process, which also has the effect of reducing the height of the oxide peaks. In FIG. 7H a silicon oxynitride layer 755 is formed on the TEOS-oxide layer 750 as a passivation overcoat (PO) layer. Other dielectric materials may be used in other examples, e.g. silicon nitride. Finally, in FIG. 7J, an opening is formed that exposes the top metal plate 303 for electrical contact.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. An integrated circuit, comprising:
    a semiconductor substrate including a device die that includes transistors configured to execute an electrical function;
    a first intrametal dielectric (IMD) layer of the device die, the first IMD layer configured to route electrical signals or power to terminals of the transistors;
    an interlevel dielectric (ILD) layer located over the IMD layer;
    a metal electrode located over the ILD layer;
    a dielectric barrier layer located between the ILD layer and the metal electrode;
    a scribe seal surrounding the device die; and
    a first opening within the dielectric barrier layer, the first opening surrounding the metal electrode; and
    second and third openings within the dielectric barrier layer, the second and third openings located between the first opening and the scribe seal.

2. The integrated circuit of claim 1, further comprising a second IMD layer over the ILD layer, wherein the second IMD layer touches the ILD layer within the openings.

3. The integrated circuit of claim 1, wherein the first and second IMD layers comprise silicon oxide formed from a high-density plasma process using silane feedstock.

4. The integrated circuit of claim 1, wherein a cumulative area of the openings is at least about 2% of a total area of the device die circumscribed by the scribe seal.

5. The integrated circuit of claim 1, wherein the ILD layer includes a first dielectric material, and the dielectric barrier layer includes a second different dielectric material.

6. The integrated circuit of claim 5, wherein the second different dielectric material has a lower hydrogen diffusion coefficient than the first dielectric material.

7. The integrated circuit of claim 1, wherein the dielectric barrier layer includes a first sublayer of a first barrier dielectric material over a second sublayer of a different second barrier dielectric material.

8. The integrated circuit of claim 7, wherein the first sublayer comprises silicon nitride and the second sublayer comprises silicon oxynitride.

9. The integrated circuit of claim 7, wherein the first sublayer has a thickness of about 600 nm and second sublayer has a thickness of about nm under the metal plate.

10. The integrated circuit of claim 7, wherein a thickness of the first sublayer is about twice a thickness of the second sublayer.

11. The integrated circuit of claim 1, further comprising a scribe lane bordering at least one side of the device die and including a plurality of additional openings within the dielectric barrier layer.

12. The integrated circuit of claim 11, wherein the scribe lane further includes a parametric test module having a length about equal to a distance between adjacent scribe lane openings.

13. An integrated circuit, comprising:
a semiconductor substrate including a device die;
a bottom metal plate in a lower intrametal dielectric (IMD) layer over the substrate and a top metal plate over the bottom metal plate, the top metal plate located in an upper IMD layer;
a dielectric barrier layer located between the lower and upper IMD layers and touching a bottom surface of the top metal plate;
a trench opening in the dielectric barrier layer, the trench opening surrounding the top metal plate;
a scribe seal surrounding the trench opening;
at least two peripheral openings in the dielectric barrier layer, the peripheral openings located between the scribe seal and the trench opening.

14. The integrated circuit of claim 13, wherein the lower and upper 1 MB layers comprise silicon oxide formed from a high-density plasma process using silane feedstock.

15. The integrated circuit of claim 13, wherein a cumulative area of the trench opening and the first and second peripheral openings is at least about 2% of a total area of the device die circumscribed by the scribe seal.

16. The integrated circuit of claim 13, further comprising an interlevel dielectric (ILD) touching a lower surface of the dielectric barrier, the ILD layer including a first dielectric material, and the dielectric barrier layer including a second different dielectric material.

17. The integrated circuit of claim 16, wherein the second different dielectric material has a lower hydrogen diffusion coefficient than the first dielectric material.

18. The integrated circuit of claim 13, wherein the dielectric barrier layer includes a first sublayer of a first barrier dielectric material over a second sublayer of a different second barrier dielectric material.

19. The integrated circuit of claim 18, wherein the first sublayer comprises silicon nitride and the second sublayer comprises silicon oxynitride.

20. The integrated circuit of claim 18, wherein the first sublayer has a thickness of about 600 nm and second sublayer has a thickness of about 300 nm under the metal plate.

21. The integrated circuit of claim 18, wherein a thickness of the first sublayer is about twice a thickness of the second sublayer.

22. The integrated circuit of claim 13, further comprising a scribe lane bordering at least one side of the device die and including a plurality of additional openings within the dielectric barrier layer.

23. The integrated circuit of claim 22, wherein the scribe lane further includes a parametric test module having a length about equal to a distance between adjacent scribe lane openings.

24. The integrated circuit of claim 22, wherein the peripheral openings are within 250 μm from the scribe seal.

* * * * *